(12) United States Patent
Miyamoto (10) Patent No.: US 12,388,418 B2
(45) Date of Patent: Aug. 12, 2025

(54) COMPOSITE FILTER DEVICE (71) Applicant: Murata Manufacturing Co., Ltd., Nagaokakyo (JP)

(72) Inventor: Koji Miyamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 272 days.

(21) Appl. No.: 18/207,172

(22) Filed: Jun. 8, 2023

(65) Prior Publication Data

US 2023/0318571 A1 Oct. 5, 2023

Related U.S. Application Data (63) Continuation of application No. PCT/JP2021/044942, filed on Dec. 7, 2021.

(30) Foreign Application Priority Data

Dec. 22, 2020 (JP) ................................ 2020-212494

(51) Int. Cl.
*H03H 9/56* (2006.01)
*H03H 9/02* (2006.01)
*H03H 9/13* (2006.01)

(52) U.S. Cl.
CPC ........ *H03H 9/568* (2013.01); *H03H 9/02031* (2013.01); *H03H 9/02157* (2013.01); *H03H 9/133* (2013.01); *H03H 9/562* (2013.01)

(58) Field of Classification Search
CPC ........... H03H 9/14544; H03H 9/02031; H03H 9/02157; H03H 9/6496; H03H 9/6483;
(Continued)

(56) References Cited

U.S. PATENT DOCUMENTS

2013/0147678 A1* 6/2013 Taniguchi .............. H03H 9/706
   343/858
2016/0065174 A1* 3/2016 Takata ................... H03H 9/725
   333/135
(Continued)

FOREIGN PATENT DOCUMENTS

JP 2013081068 A 5/2013
JP 2016054393 A 4/2016
(Continued)

OTHER PUBLICATIONS

International Search Report in PCT/JP2021/044942, mailed Mar. 1, 2022, 3 pages.
(Continued)

*Primary Examiner* — Quan Tra
(74) *Attorney, Agent, or Firm* — Keating & Bennett, LLP (57) ABSTRACT

A composite filter device includes a ladder filter and at least one bandpass filter including one end connected in common to the ladder filter, the ladder filter including at least one serial arm resonator including a first serial arm resonator and at least one parallel arm resonator including a first parallel arm resonator. The first serial arm resonator is the closest serial arm resonator to a common terminal, and the first parallel arm resonator is the closest parallel arm resonator to the common terminal. Expression (1), Expression (2), or Expression (3) is satisfied, where a duty of an IDT of the first serial arm resonator is Sa, a duty of an IDT of the first parallel arm resonator is Pa, and a duty of an IDT of each of serial arm resonators other than the first serial arm resonator and of parallel arm resonators other than the first parallel arm resonator is Ta:

$Sa < Pa < Ta$      Expression (1)

$Ta < Sa < Pa$      Expression (2)

$Pa < Ta < Sa$      Expression (3).

20 Claims, 7 Drawing Sheets

(58) Field of Classification Search
CPC ........ H03H 9/562; H03H 9/725; H03H 9/133; H03H 9/568
See application file for complete search history.

(56) References Cited

U.S. PATENT DOCUMENTS

2019/0190494 A1    6/2019  Nosaka
2019/0222192 A1*  7/2019  Nakahashi ............... H03H 9/64
2019/0356302 A1  11/2019  Yasuda

FOREIGN PATENT DOCUMENTS

| WO | 2018003268 A1 | 1/2018 |
| WO | 2018043607 A1 | 3/2018 |
| WO | 2018142794 A1 | 8/2018 |

OTHER PUBLICATIONS

Written Opinion in PCT/JP2021/044942, mailed Mar. 1, 2022, 3 pages.

* cited by examiner

FIG. 9C

COMPOSITE FILTER DEVICE

CROSS REFERENCE TO RELATED APPLICATIONS

This application claims the benefit of priority to Japanese Patent Application No. 2020-212494 filed on Dec. 22, 2020 and is a Continuation Application of PCT Application No. PCT/JP2021/044942 filed on Dec. 7, 2021. The entire contents of each application are hereby incorporated herein by reference.

BACKGROUND OF THE INVENTION

1. Field of the Invention

The present invention relates to a composite filter device in which at least one bandpass filter is connected in common to a ladder filter.

2. Description of the Related Art

To date, a composite filter device is used for the IF stage of a mobile communication device such as a smartphone. In the composite filter device, respective ends of a plurality of bandpass filters are connected in common to each other. In a composite filter device described in Japanese Unexamined Patent Application Publication No. 2013-81068, respective ends of a ladder filter and a different bandpass filter are connected in common to each other. This ladder filter has serial arm resonators and parallel arm resonators each of which is an acoustic wave resonator.

SUMMARY OF THE INVENTION

In the composite filter device described in Japanese Unexamined Patent Application Publication No. 2013-81068, a leaky surface acoustic wave is utilized, and a ripple caused by a Rayleigh wave appears outside the passband. If the ripple is located in the passband of the different bandpass filter subjected to the common connection, the different bandpass filter has a problem of a loss increase in the passband and a deteriorated characteristic.

Preferred embodiments of the present invention provide composite filter devices that each prevent ripples in passbands of different bandpass filters subjected to a common connection. A composite filter device according to a preferred embodiment of the present invention includes a ladder filter including at least one serial arm resonator including a first serial arm resonator and at least one parallel arm resonator including a first parallel arm resonator, the serial arm resonator and the parallel arm resonator being an acoustic wave resonator including an IDT electrode, and at least one bandpass filter including one end connected to one end of the ladder filter at a common terminal. The first serial arm resonator is closest to the common terminal in the serial arm resonator of the ladder filter, and the first parallel arm resonator is closest to the common terminal in the parallel arm resonator of the ladder filter. Expression (1), or Expression (2), or Expression (3) is satisfied, where a duty of an IDT electrode of the first serial arm resonator is Sa, a duty of an IDT electrode of the first parallel arm resonator is Pa, and a duty of an IDT electrode of each of a serial arm resonator and a parallel arm resonator that are respectively included in the serial arm resonator and the parallel arm resonator and that are resonators other than the first serial arm resonator and the first parallel arm resonator is Ta:

$$Sa < Pa < Ta \quad \text{Expression (1)}$$

$$Ta < Sa < Pa \quad \text{Expression (2)}$$

$$Pa < Ta < Sa \quad \text{Expression (3)}.$$

Composite filter devices according to preferred embodiments of the present invention prevent ripples in the passbands of different bandpass filters subjected to common connection.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention are described with reference to the drawings to clarify the present invention.

It is noted that the preferred embodiments described in this specification are illustrative and configurations may be partially replaced or combined with each other in respective different preferred embodiments.

Figure 1:
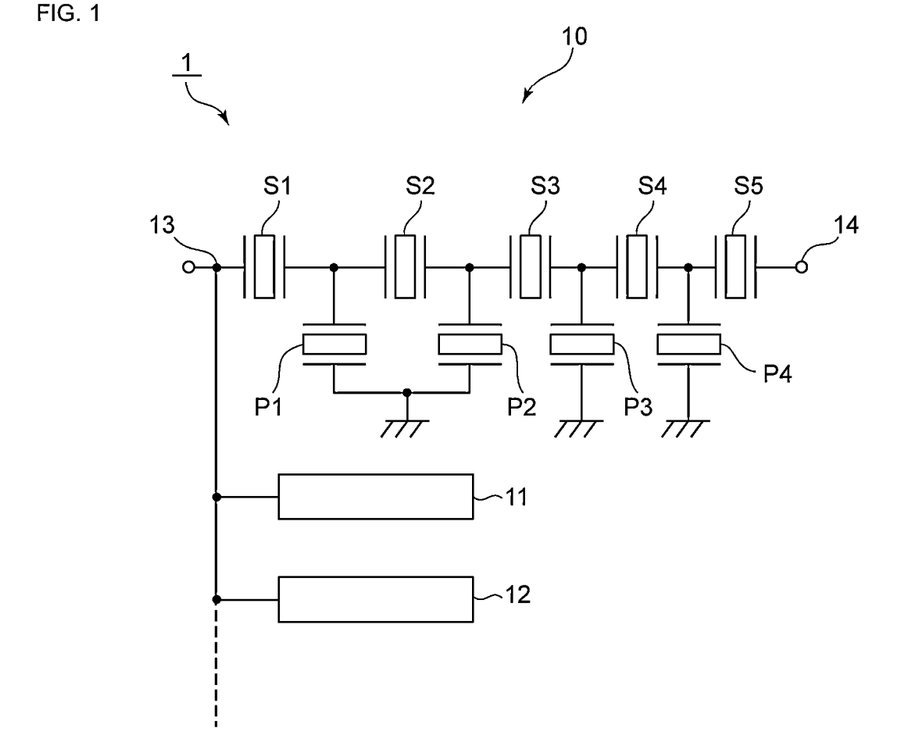
FIG. 1 is a circuit diagram of a composite filter device according to a first preferred embodiment of the present invention.

FIG. 1 is a circuit diagram of a composite filter device according to a first preferred embodiment of the present invention. In a composite filter device 1, one end of a ladder filter 10 is connected, at a common terminal 13, in common to one end of each of bandpass filters 11, 12, etc., that are different from the ladder filter 10. The common terminal 13 is connected to, for example, an antenna terminal.

The ladder filter 10 includes serial arms connecting the common terminal 13 and a terminal 14. In the serial arms, first to fifth serial arm resonators S1 to S5 are connected in series one after another. A first parallel arm resonator P1 is connected between a ground potential and a node between the first and second serial arm resonators S1 and S2. A second parallel arm resonator P2 is connected between the ground potential and a node between the second serial arm resonator S2 and the third serial arm resonator S3. A third parallel arm resonator P3 is connected between a ground potential and a node between the third serial arm resonator S3 and the fourth serial arm resonator S4. A fourth parallel arm resonator P4 is connected between a ground potential and a node between the fourth serial arm resonator S4 and the fifth serial arm resonator S5.

The first serial arm resonator S1 to the fifth serial arm resonator S5 and the first parallel arm resonator P1 to the fourth parallel arm resonator P4 are each an acoustic wave resonator.

The circuit configuration of each of the different bandpass filters 11 and 12 is not limited to this configuration. The bandpass filters 11 and 12 may be a ladder filter and may be a bandpass filter including a longitudinally coupled resonator-type acoustic wave filter or the like.

Nevertheless, the passbands of the bandpass filters 11 and 12 are different from the passband of the ladder filter 10.

In this preferred embodiment, the ladder filter 10 is a Band1Tx filter, and the passband thereof ranges from about 1920 MHz to about 1980 MHz. The bandpass filter 11 is a Band32 filter, and the passband thereof ranges from about 1452 MHz to about 1496 MHz.

Figure 2:
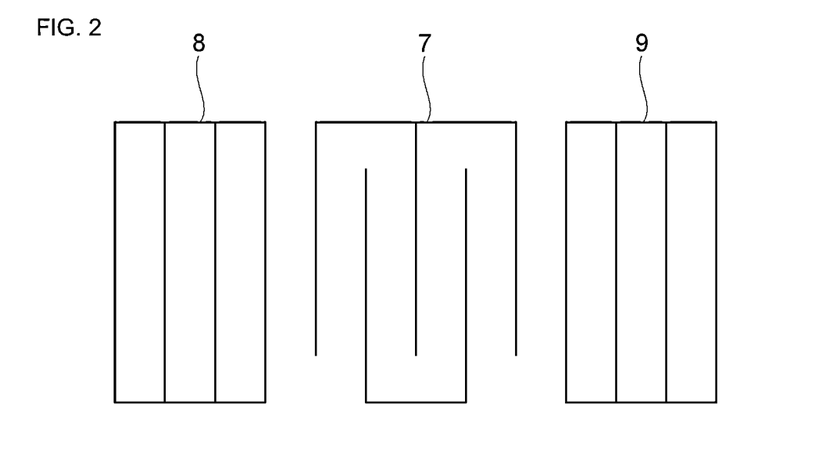
FIG. 2 is a schematic plan view illustrating the electrode structure of an acoustic wave resonator included in the first preferred embodiment of the present invention.

FIG. 2 illustrates the electrode structure of each of the acoustic wave resonators forming the first serial arm resonator S1 to the fifth serial arm resonator S5 and the first parallel arm resonator P1 to the fourth parallel arm resonator P4.

In each acoustic wave resonator, reflectors 8 and 9 are disposed on both sides of an IDT electrode 7 in an acoustic-wave propagation direction. A one-port acoustic wave resonator is thus provided.

Figure 3A:
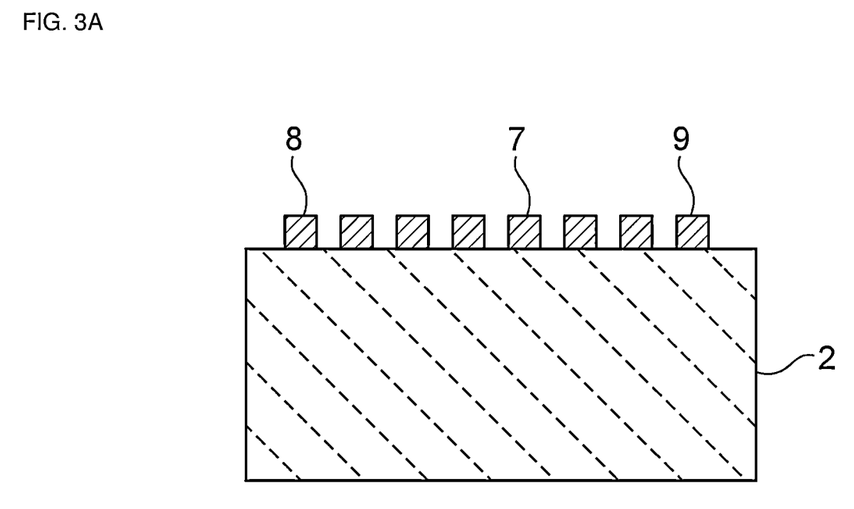
FIG. 3A is a front cross-sectional view of the acoustic wave resonator included in the first preferred embodiment of the present invention.

FIG. 3A is a front cross-sectional view of the acoustic wave resonator of the first preferred embodiment. The IDT electrode 7 and the reflectors 8 and 9 are disposed on a piezoelectric substrate 2 defining and functioning as a piezoelectric layer. The piezoelectric substrate 2 is a $LiTaO_3$ substrate. The piezoelectric substrate 2 may be formed from another piezoelectric single crystal.

Figure 3B:
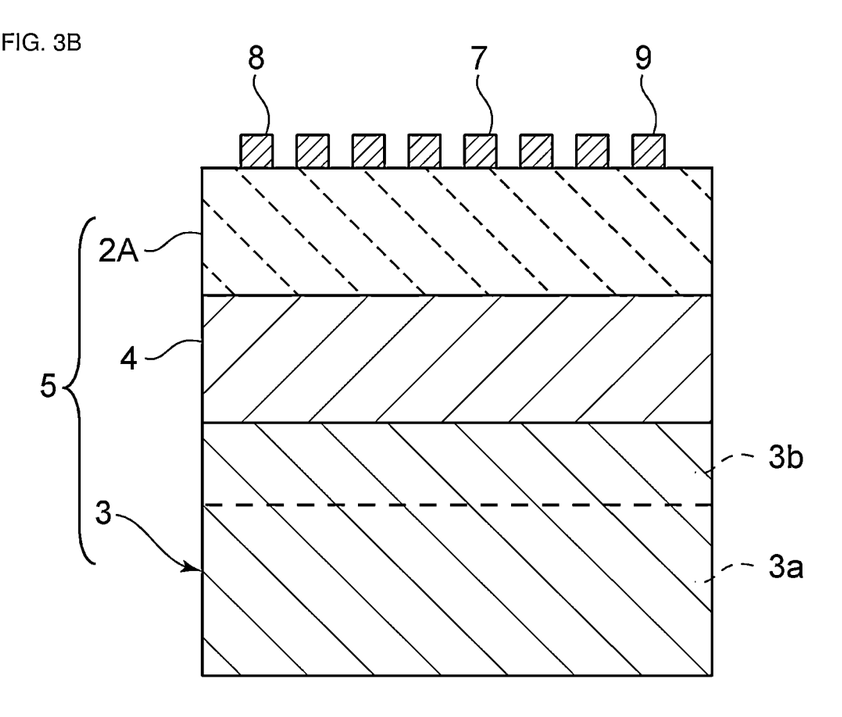
FIG. 3B is a front cross-sectional view illustrating a modification of the acoustic wave resonator.

FIG. 3B is a front cross-sectional view for explaining a modification of the acoustic wave resonator. In this modification, the IDT electrode 7 and the reflectors 8 and 9 are disposed on a composite piezoelectric substrate 5. In the composite piezoelectric substrate 5, a low acoustic-velocity layer 4 and a piezoelectric layer 2A are laminated on a support substrate 3 formed from Si or the like. The piezoelectric layer 2A is formed from $LiTaO_3$ or $LiNbO_3$, and the thickness is designed to be about $10\lambda$ or lower, for example, where a wavelength determined based on the electrode finger pitch of the IDT electrode 7 is $\lambda$. The thickness is preferably about $5\lambda$ or lower, for example. The low acoustic-velocity layer 4 is formed from a low-acoustic velocity material through which a bulk wave propagates at an acoustic velocity lower than the acoustic velocity of a bulk wave propagating through the piezoelectric layer 2A. As such a low-acoustic velocity material, silicon oxide, glass, silicon oxynitride, tantalum pentoxide, a compound or the like formed by adding fluorine, carbon, or boron to silicon oxide, or a medium or the like having any of the materials above as a main component can be cited.

The support substrate 3 may be formed from various dielectrics or a piezoelectric body as well as Si. The support substrate 3 is preferably formed from a high-acoustic velocity material.

The high-acoustic velocity material means a material through which a bulk wave propagates at an acoustic velocity higher than the acoustic velocity of an acoustic wave propagating through the piezoelectric layer 2A. As such a high-acoustic velocity material, for example, various materials can be cited, such as aluminum oxide, silicon carbide, silicon nitride, silicon oxynitride, silicon, sapphire, lithium tantalate, lithium niobate, crystal, alumina, zirconia, cordierite, mullite, steatite, forsterite, magnesia, a diamondlike carbon (DLC) film or diamond, a medium or the like having any of the materials above as a main component, and a material having a mixture of the materials above as a main component.

Since the composite piezoelectric substrate 5 has the laminated structure described above, the acoustic wave can be effectively confined in the piezoelectric layer 2A. A Q value can thus be improved.

In place of the structure using a support substrate formed from the high-acoustic velocity material as the support substrate 3, a structure in which a high acoustic-velocity member 3b is laminated on a substrate 3a may be used. The high acoustic-velocity member 3b is formed from the high-acoustic velocity material described above. In this case, the substrate 3a may be formed from a material other than the high-acoustic velocity material. Various dielectrics and semiconductors may be used as such a material.

The composite filter device 1 has the following features.

In the ladder filter 10, the serial arm resonator closest to the common terminal 13 is the first serial arm resonator S1, and the parallel arm resonator closest to the common terminal 13 is the first parallel arm resonator P1. The duty of the IDT electrode of the first serial arm resonator S1 is Sa, the duty of the IDT electrode of the first parallel arm resonator P1 is Pa, and the duty of the IDT electrode of each of the second serial arm resonator S2 to the fifth serial arm resonator S5 and the second parallel arm resonator P2 to the fourth parallel arm resonator P4 that are resonators other than the first serial arm resonator S1 and the first parallel arm resonator P1 is Ta. In this case, one of Expression (1), Expression (2), or Expression (3) below is satisfied.

$$Sa<Pa<Ta \quad \text{Expression (1)}$$

$$Ta<Sa<Pa \quad \text{Expression (2)}$$

$$Pa<Ta<Sa \quad \text{Expression (3)}$$

Since the duties of the acoustic wave resonators of the ladder filter 10 in the composite filter device 1 satisfies one of Expressions (1) to (3), the occurrence of a ripple in the passband can be prevented in the bandpass filter 11. This enables the deterioration of loss in the passband of the bandpass filter 11 to be prevented and enables the filter characteristic thereof to be improved.

This will be described in more detail.

Figure 4:
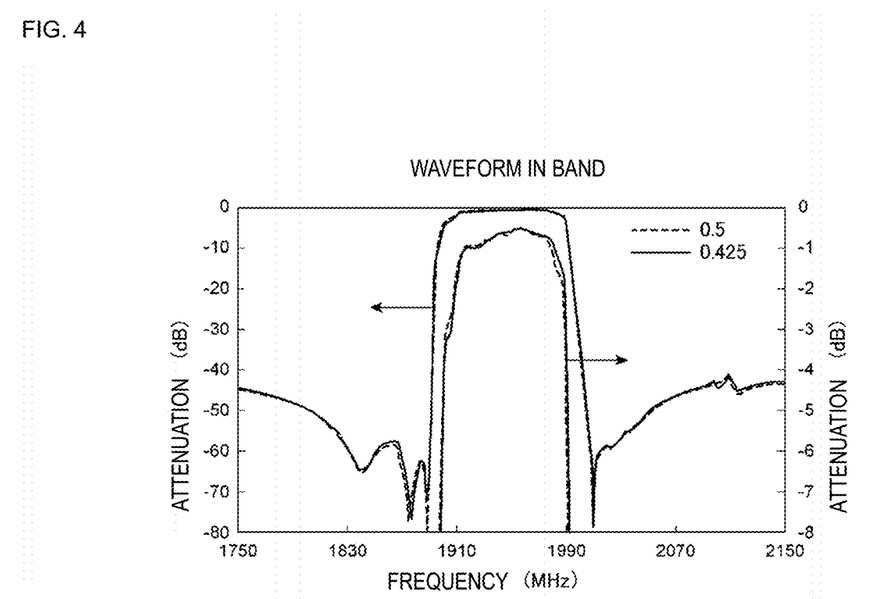
FIG. 4 is a graph illustrating filter characteristics of a ladder filter at the time when the duties of a first serial arm resonator in the ladder filter are respectively about 0.5 and about 0.425.

FIG. 4 is a graph illustrating filter characteristics of the ladder filter 10 at the time when the duties of the first serial arm resonator S1 are respectively about 0.425 and about 0.5, for example. The broken line represents the result in the case of the duty=about 0.5, and the solid line represents the result in the case of the duty=about 0.425.

A wavelength determined based on the electrode finger pitch of the IDT electrode and the intersecting width of the IDT electrode are adjusted in accordance with the duty change, and the characteristic is thus adjusted.

As clear from FIG. 4, even if the duty is changed from about 0.5 to about 0.425, for example, the filter characteristics of the duties almost match, and thus deterioration of insertion loss in the filter characteristic and deterioration of an attenuation characteristic due to the duty change do not occur.

If the LiTaO$_3$ substrate is used as the piezoelectric substrate, a response of the Rayleigh wave occurs at a position about 0.76 times as high as a resonant frequency fr, for example.

The intersecting width and the number of pairs of electrode fingers of the IDT electrode of the first serial arm resonator S1 at the time when the duties are about 0.5 and about 0.425 are also described in Table 1 below. As described in Table 1, the first serial arm resonator S1 has a size relationship between duties that is opposite to a size relationship between wavelengths each determined based on the electrode finger pitch. The relationship preferably is satisfied among a plurality of serial arm resonators or a plurality of parallel arm resonators.

TABLE 1

| Duty | 0.5 | 0.425 |
|---|---|---|
| Wavelength | 1.9237 | 1.9387 |
| Intersecting width | 25.4 | 30.6 |
| Number of pairs of electrode fingers | 160 | 160 |

Figure 5:
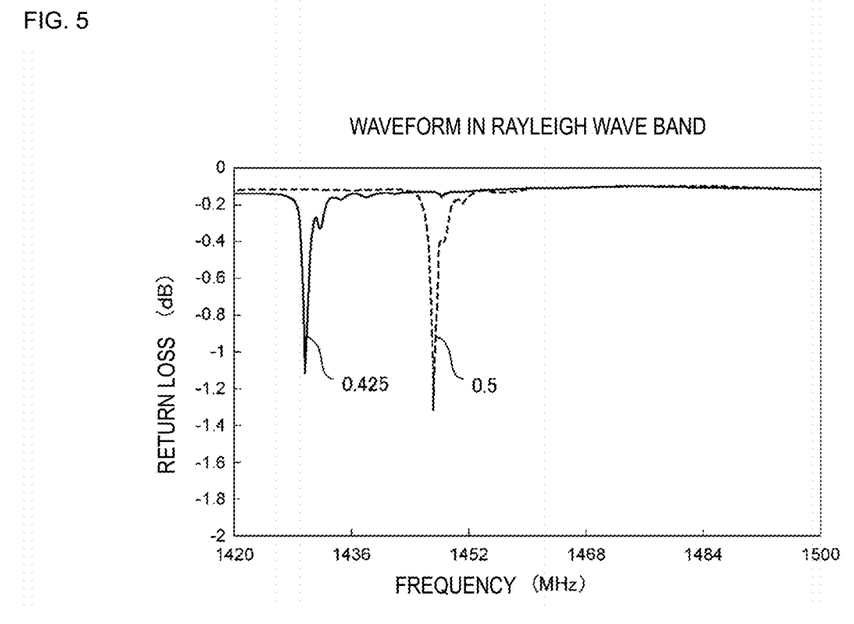
FIG. 5 is a graph illustrating return loss characteristics of Rayleigh waves of a different bandpass filter subjected to common connection in a case where the duty of the first serial arm resonator in the ladder filter is changed from about 0.5 to about 0.425.

As described above, FIG. 5 illustrates the waveforms of the response of the Rayleigh waves, that is, return loss characteristics in the case where the duty is changed from about 0.5 to about 0.425, for example. The solid line in FIG. 5 represents the result of the case of the duty=about 0.425, and the broken line represents the result of the case of the duty=about 0.5.

Changing the duty of the first serial arm resonator S1 from about 0.5 to about 0.425 causes the response of the Rayleigh wave to shift from about 1447.2 MHz to about 1429.8 MHz, for example. That is, the response of the Rayleigh wave shifts to a lower band side. The present preferred embodiment utilizes the shifting of the frequency position of the response of the Rayleigh wave, the shifting being caused by changing the duty of the IDT electrode as described above.

Figure 6A:
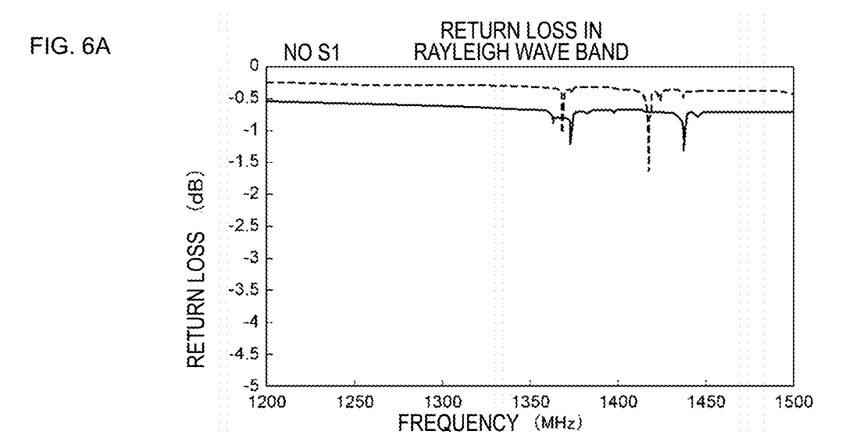
FIG. 6A is a graph illustrating a return loss characteristic of the ladder filter and a return loss characteristic at the time when the first serial arm resonator is removed from the ladder filter.
Figure 6B:
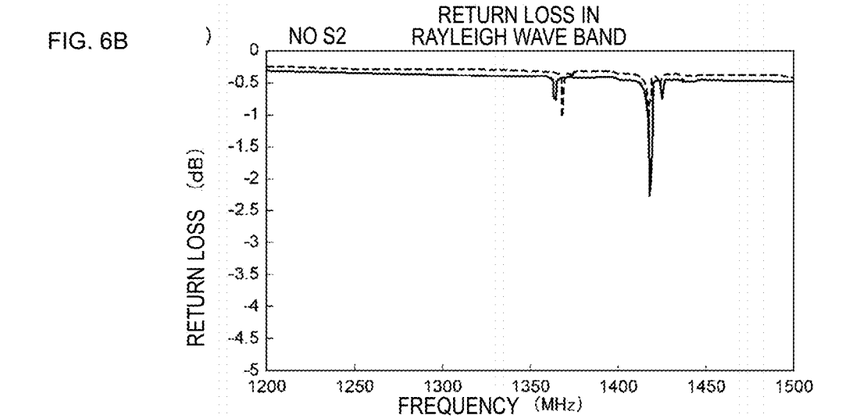
FIG. 6B is a graph illustrating a return loss characteristic of the ladder filter and a return loss characteristic at the time when a second serial arm resonator is removed from the ladder filter.
Figure 6C:
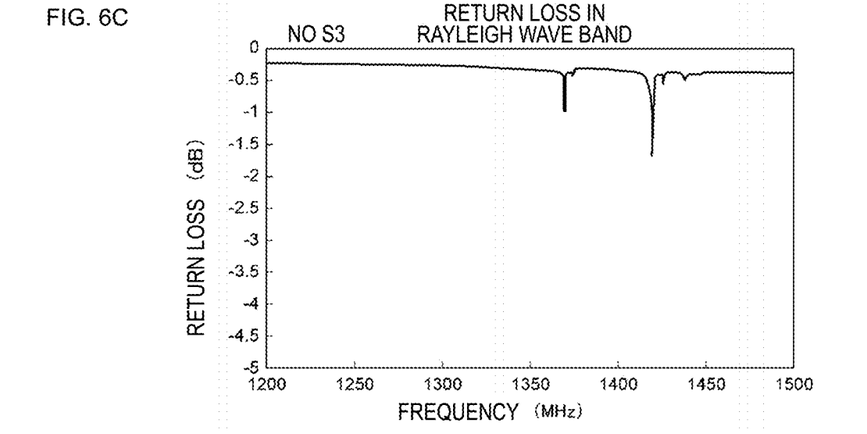
FIG. 6C is a graph illustrating a return loss characteristic of the ladder filter and a return loss characteristic at the time when a third serial arm resonator is removed from the ladder filter.
Figure 7A:
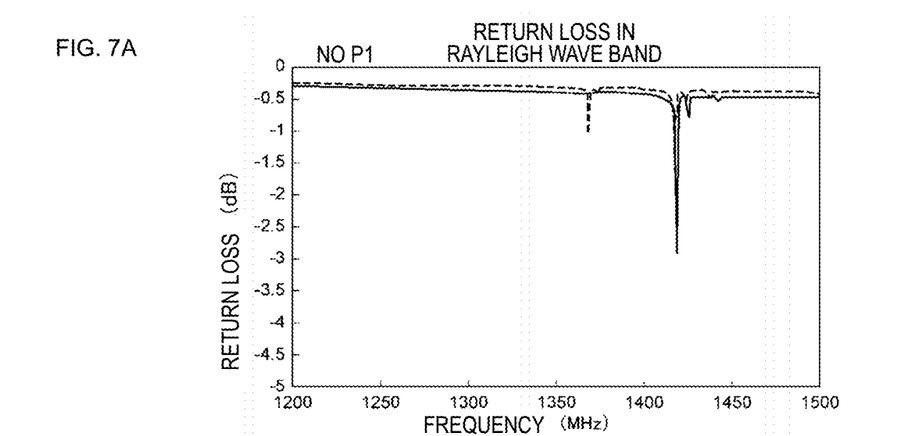
FIG. 7A is a graph illustrating a return loss characteristic of the ladder filter and a return loss characteristic at the time when a first parallel arm resonator is removed from the ladder filter.

Each solid line in a corresponding one of FIGS. 6A to 6C, FIGS. 7A to 7C, and FIGS. 8A to 8C forms a return loss characteristic graph representing the response of the Rayleigh wave with one of the resonators being removed from the ladder filter 10. Each broken line in a corresponding one of FIGS. 6A, 6B, and FIG. 7A represents the return loss characteristic of the ladder filter 10 itself.

The solid line in FIG. 6A represents the return loss characteristic of the filter in which the first serial arm resonator S1 is removed, the solid line in FIG. 6B represents the return loss characteristic of the filter in which the second serial arm resonator S2 is removed, and the solid line in FIG. 6C represents the return loss characteristic of the filter in which the third serial arm resonator S3 is removed.

Figure 7B:
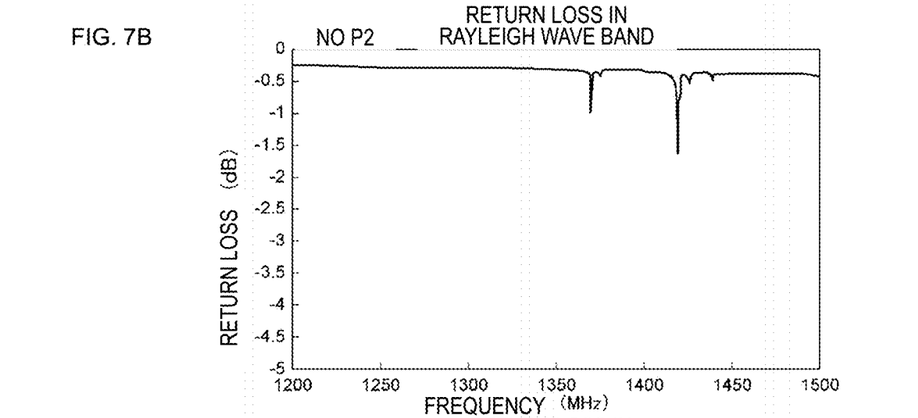
FIG. 7B is a graph illustrating a return loss characteristic of the ladder filter and a return loss characteristic at the time when a second parallel arm resonator is removed from the ladder filter.
Figure 7C:
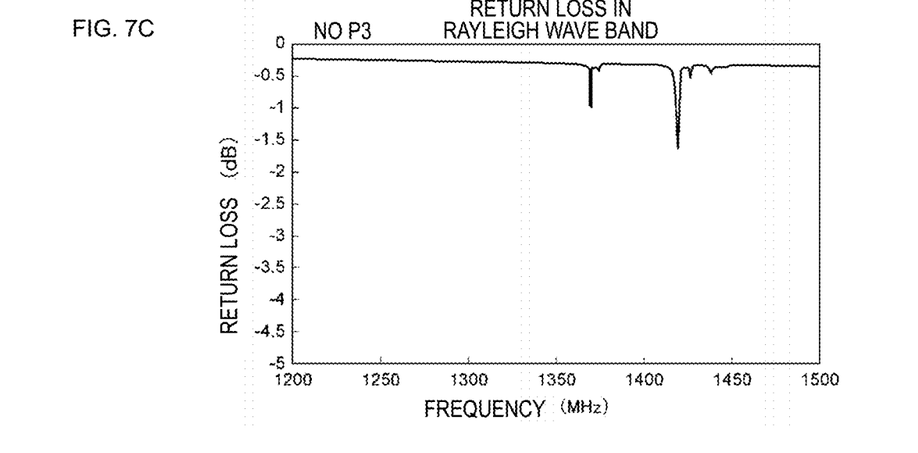
FIG. 7C is a graph illustrating a return loss characteristic of the ladder filter and a return loss characteristic at the time when a third parallel arm resonator is removed from the ladder filter.

The solid line in FIG. 7A represents the return loss characteristic of the filter in which the first parallel arm resonator P1 is removed, the solid line in FIG. 7B represents the return loss characteristic of the filter in which the second parallel arm resonator P2 is removed, and the solid line in FIG. 7C represents the return loss characteristic of the filter in which the third parallel arm resonator P3 is removed.

Figure 8A:
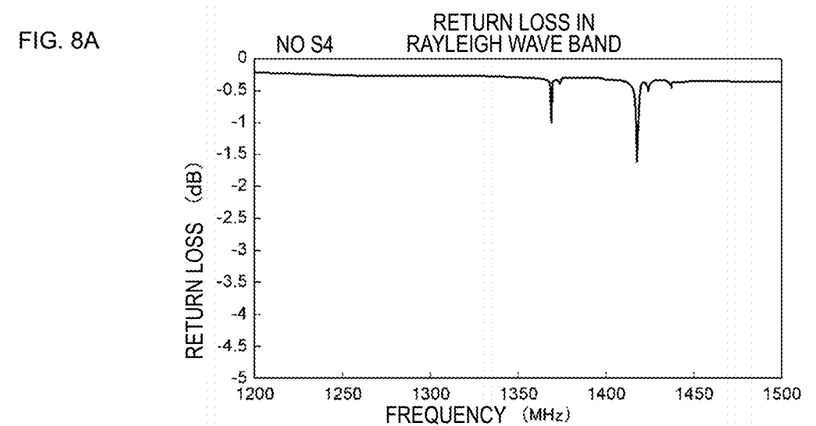
FIG. 8A is a graph illustrating a return loss characteristic of the ladder filter and a return loss characteristic at the time when the fourth serial arm resonator is removed from the ladder filter.
Figure 8B:
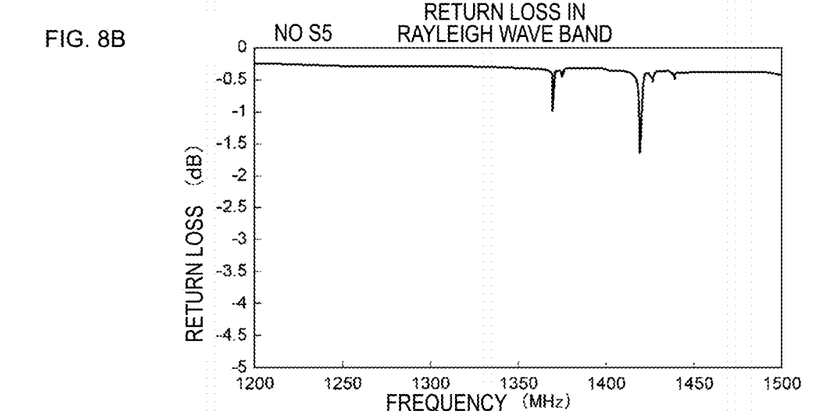
FIG. 8B is a graph illustrating a return loss characteristic of the ladder filter and a return loss characteristic at the time when the fifth serial arm resonator is removed from the ladder filter.
Figure 8C:
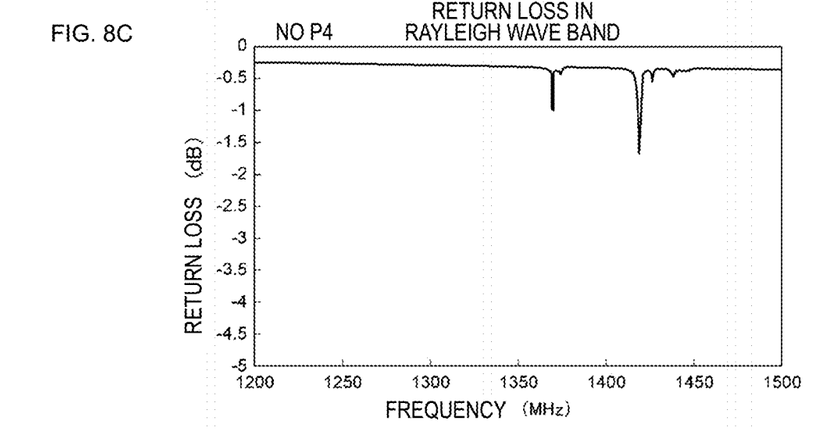
FIG. 8C is a graph illustrating a return loss characteristic of the ladder filter and a return loss characteristic at the time when the fourth parallel arm resonator is removed from the ladder filter.

The solid line in FIG. 8A represents the return loss characteristic of the filter in which the fourth serial arm resonator S4 is removed, the solid line in FIG. 8B represents the return loss characteristic of the filter in which the fifth serial arm resonator S5 is removed, and the solid line in FIG. 8C represents the return loss characteristic of the filter in which the fourth parallel arm resonator P4 is removed.

As a method for removing one of the serial arm resonators or the parallel arm resonators, the serial arm resonator is short-circuited, and the parallel arm resonator is open.

As clear from FIG. 6A to FIG. 8C, it is understood that the frequency position of the response of the Rayleigh wave has a large influence in the case where the first serial arm resonator S1 that is the serial arm resonator closest to the common terminal 13 is removed and in the case where the first parallel arm resonator P1 that is the parallel arm resonator closest to the common terminal 13 is removed and has a small influence in the case of the other resonators.

It is understood that changing the duty of the first serial arm resonator S1 and the first parallel arm resonator P1 as described above enables the frequency position of the response of the Rayleigh wave to be changed largely. In a preferred embodiment of the present invention, one of Expressions (1) to (3) described above is satisfied in the case where the duty of the IDT electrode of the first serial arm resonator S1 is Sa, the duty of the IDT electrode of the first parallel arm resonator P1 is Pa, and the duty of the IDT electrode of each of the second serial arm resonator S2 to the fifth serial arm resonator S5 and the second parallel arm resonator P2 to the fourth parallel arm resonator P4 that are resonators other than the first serial arm resonator S1 and the first parallel arm resonator P1 is Ta. In the following preferred embodiments [1] to [3], the filter characteristic of the bandpass filter 11 may be improved as a result.

Figure 9A:
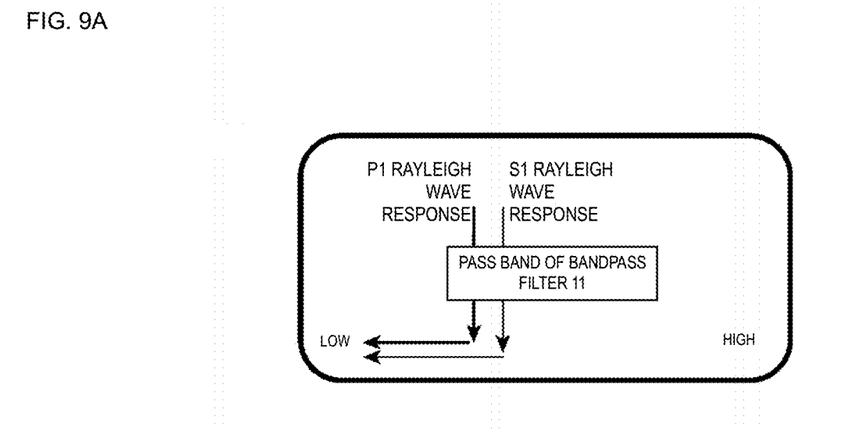
FIG. 9A is a specific explanatory view illustrating a configuration causing a response of a Rayleigh wave caused by the first parallel arm resonator P1 and a response of a Rayleigh wave caused by the first serial arm resonator S1 to shift to a band lower than the passband of the different bandpass filter.

[1] In the first preferred embodiment, in a case where the duty Sa of the IDT electrode of the first serial arm resonator S1 is decreased, the frequency position of a response of a Rayleigh wave shifts to a lower band side as described above. Likewise, in a case where the duty Pa of the IDT electrode of the first parallel arm resonator P1 is decreased, the response of the Rayleigh wave shifts to the lower band side. Accordingly, as illustrated in FIG. 9A, a response of a Rayleigh wave caused by the first serial arm resonator S1 and a response of a Rayleigh wave caused by the first parallel arm resonator P1 can be shifted to a band lower than the passband of the bandpass filter 11, that is, to a band lower than and outside the passband of the bandpass filter 11. In the ladder filter 10, the resonant frequency of a serial arm resonator becomes higher than the resonant frequency of a parallel arm resonator. Accordingly, if the response of the Rayleigh wave is shifted from the passband of the bandpass filter 11 to the outside of the passband, the duty Sa of the IDT electrode of the first serial arm resonator S1 is lower than the duty Pa of the IDT electrode of the first parallel arm resonator P1. Accordingly, as illustrated in FIG. 9A, the relation "Sa<Pa<Ta" enables a ripple in the passband of the bandpass filter 11 to be prevented from occurring and enables the filter characteristic of the bandpass filter 11 to be improved.

Figure 9B:
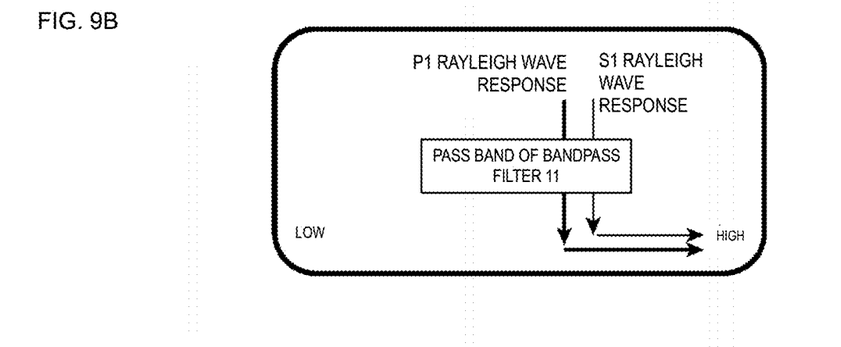
FIG. 9B is a specific explanatory view illustrating a configuration causing the response of the Rayleigh wave caused by the first parallel arm resonator P1 and the response of the Rayleigh wave caused by the first serial arm resonator S1 to shift to a band higher than the passband of the different bandpass filter.

[2] In a second preferred embodiment, as illustrated in FIG. 9B, a response of a Rayleigh wave caused by the first serial arm resonator S1 and a response of a Rayleigh wave caused by the first parallel arm resonator P1 are shifted to a band higher than the passband of the bandpass filter 11, that is, to a band higher than and outside the passband. Accordingly, it suffices that Ta<Sa<Pa is satisfied.

Figure 9C:
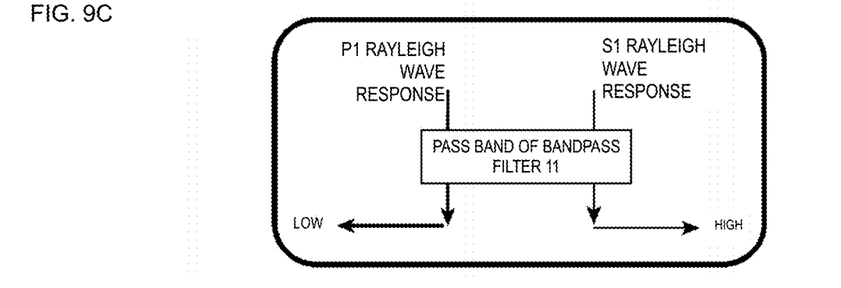
FIG. 9C is a specific explanatory view for explaining a configuration causing the response of the Rayleigh wave caused by the first parallel arm resonator P1 to a band lower than the passband of the different bandpass filter and the response of the Rayleigh wave caused by the first serial arm resonator S1 to shift to a band higher than the passband.

[3] In a third preferred embodiment, as illustrated in FIG. 9C, a response of a Rayleigh wave caused by the first serial arm resonator S1 is shifted to a band higher than the passband of the bandpass filter 11, and a response of a Rayleigh wave caused by the first parallel arm resonator P1 is shifted to a band lower than the passband of the bandpass filter 11. In this case, Pa<Ta<Sa is satisfied.

As described above, in view of the large influence of the duty of the first serial arm resonator S1 and the first parallel arm resonator P1 on the frequency position of a response of the Rayleigh wave in the ladder filter 10, a preferred embodiment of the present invention is configured to satisfy Expression (1), Expression (2), or Expression (3). A ripple due to the Rayleigh wave is thus shifted to the outside of the passband of the bandpass filter 11. The filter characteristic of the bandpass filter 11 serving as a different bandpass filter subjected to common connection can thus be improved.

In the preferred embodiments above, the passband of the bandpass filter 11 is described as the passband of the different bandpass filter. However, to improve the filter characteristic of the passband of a bandpass filter 12 or another different bandpass filter subjected to common connection, the duty of the IDT electrode of the first serial arm resonator S1 and the duty of the IDT electrode of the first parallel arm resonator P1 may be configured to satisfy one of Expressions (1) to (3) above.

Also in this case, the filter characteristic of the different bandpass filter subjected to common connection can likewise be improved.

In addition, the duty is adjusted in preferred embodiments of the present invention, the filter characteristic described above can be improved with almost no influence on insertion loss or the attenuation characteristic of the different bandpass filter subjected to the common connection or the ladder filter itself.

The common terminal 13 is disposed on an antenna terminal connection side in the preferred embodiments above. However, in a preferred embodiment of the present invention, the common terminal may be disposed on the output end side. That is, the common terminal 13 defines and functions as an input terminal if the ladder filter 10 is a reception filter, and the common terminal 13 defines and functions as an output terminal if the ladder filter 10 is a transmission filter. In each case, preferred embodiments of the present invention can prevent a ripple in the passband of the different bandpass filter from occurring.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite filter device comprising:
   a ladder filter including at least one serial arm resonator including a first serial arm resonator and at least one parallel arm resonator including a first parallel arm resonator, the serial arm resonator and the parallel arm resonator being an acoustic wave resonator including an IDT electrode; and
   at least one bandpass filter including one end connected to one end of the ladder filter at a common terminal; wherein
   the first serial arm resonator is closest to the common terminal in the serial arm resonator of the ladder filter, and the first parallel arm resonator is closest to the common terminal in the parallel arm resonator of the ladder filter; and
   Expression (1), or Expression (2), or Expression (3) is satisfied, where a duty of an IDT electrode of the first serial arm resonator is Sa, a duty of an IDT electrode of the first parallel arm resonator is Pa, and a duty of an IDT electrode of each of a serial arm resonator and a parallel arm resonator that are respectively included in the serial arm resonator and the parallel arm resonator and that are resonators other than the first serial arm resonator and the first parallel arm resonator is Ta:

$Sa<Pa<Ta$      Expression (1)

$Ta<Sa<Pa$      Expression (2)

$Pa<Ta<Sa$      Expression (3).

2. The composite filter device according to claim 1, wherein the first serial arm resonator and the first parallel arm resonator each include a piezoelectric layer and the IDT electrode on the piezoelectric layer, and the piezoelectric layer includes a $LiTaO_3$ substrate.

3. The composite filter device according to claim 1, wherein the first serial arm resonator and the first parallel arm resonator each include a piezoelectric layer, the IDT electrode on the piezoelectric layer, and a high acoustic-velocity body laminated on an opposite surface of the piezoelectric layer from the IDT electrode, and the high acoustic-velocity body includes a high-acoustic velocity material through which a bulk wave propagates at a higher acoustic velocity than an acoustic velocity of an acoustic wave propagating through the piezoelectric layer.

4. The composite filter device according to claim 3, further comprising:
a low acoustic-velocity layer laminated between the high acoustic-velocity body and the piezoelectric layer and including a low-acoustic velocity material through which a bulk wave propagates at an acoustic velocity lower than the acoustic velocity of the bulk wave propagating through the piezoelectric layer.

5. The composite filter device according to claim 1, wherein a plurality of the serial arm resonators have a size relationship between duties that is opposite to a size relationship between wavelengths each determined based on an electrode finger pitch.

6. The composite filter device according to claim 1, wherein a plurality of the parallel arm resonators have a size relationship between duties that is opposite to a size relationship between wavelengths each determined based on an electrode finger pitch.

7. The composite filter device according to claim 1, wherein the common terminal is connected to an antenna terminal.

8. The composite filter device according to claim 1, wherein the ladder filter includes five serial arm resonators connected in series.

9. The composite filter device according to claim 1, wherein the ladder filter includes four parallel arm resonators connected between a ground potential and respective ones of five serial arm resonators.

10. The composite filter device according to claim 8, wherein each of the five serial arm resonators is an acoustic wave resonator.

11. The composite filter device according to claim 9, wherein each of the four parallel arm resonators is an acoustic wave resonator.

12. The composite filter device according to claim 1, wherein the at least one bandpass filter includes two bandpass filters.

13. The composite filter device according to claim 12, wherein each of the two bandpass filters is one of a ladder filter or a bandpass filter including a longitudinally-coupled resonator acoustic wave filter.

14. The composite filter device according to claim 1, wherein a passband of the at least one passband filter is different from a passband of the ladder filter.

15. The composite filter device according to claim 1, wherein the acoustic wave resonator includes reflectors on opposite sides of the IDT electrode.

16. The composite filter device according to claim 1, wherein the acoustic wave resonator is a one-port acoustic wave resonator.

17. The composite filter device according to claim 1, wherein the piezoelectric layer is a composite piezoelectric substrate including a low acoustic velocity layer and a piezoelectric layer.

18. The composite filter device according to claim 17, wherein a thickness of the piezoelectric layer is about $10\lambda$ or lower, where a wavelength determined based on an electrode finger pitch of the IDT electrode is $\lambda$.

19. The composite filter device according to claim 17, wherein a thickness of the piezoelectric layer is about $5\lambda$ or lower, where a wavelength determined based on an electrode finger pitch of the IDT electrode is $\lambda$.

20. The composite filter device according to claim 1, wherein the duty of the first serial arm resonator is about 0.425 to about 0.5.

* * * * *